(12) United States Patent
Yamashita

(10) Patent No.: US 9,312,460 B2
(45) Date of Patent: Apr. 12, 2016

(54) LIGHT EMITTING DEVICE, METHOD FOR MANUFACTURING LIGHT EMITTING DEVICE, AND PACKAGE ARRAY

(75) Inventor: Ryohei Yamashita, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 55 days.

(21) Appl. No.: 13/984,116

(22) PCT Filed: Feb. 3, 2012

(86) PCT No.: PCT/JP2012/052522
§ 371 (c)(1),
(2), (4) Date: Sep. 3, 2013

(87) PCT Pub. No.: WO2012/108356
PCT Pub. Date: Aug. 16, 2012

(65) Prior Publication Data
US 2013/0334549 A1 Dec. 19, 2013

(30) Foreign Application Priority Data

Feb. 10, 2011 (JP) ................................. 2011-027209
Feb. 10, 2011 (JP) ................................. 2011-027214

(51) Int. Cl.
*H01L 33/62* (2010.01)
*H01L 33/48* (2010.01)

(52) U.S. Cl.
CPC .............. *H01L 33/62* (2013.01); *H01L 33/486* (2013.01); *H01L 2224/48091* (2013.01); *H01L 2224/48247* (2013.01); *H01L 2224/48257* (2013.01); *H01L 2933/0033* (2013.01)

(58) Field of Classification Search
CPC ....... H01L 33/486; H01L 33/54; H01L 33/62; H01L 33/642
USPC .................. 257/91, 98, 99; 313/512; 438/106
See application file for complete search history.

(56) References Cited

U.S. PATENT DOCUMENTS

| 5,635,115 A * | 6/1997 | Konishi et al. ................. 264/1.7 |
| 2007/0241362 A1* | 10/2007 | Han et al. ....................... 257/100 |
| 2008/0048201 A1* | 2/2008 | Kim et al. ....................... 257/98 |
| 2008/0121921 A1* | 5/2008 | Loh et al. ....................... 257/99 |
| 2010/0001306 A1 | 1/2010 | Park et al. |
| 2010/0073903 A1 | 3/2010 | Yun et al. |
| 2010/0295082 A1* | 11/2010 | Kim et al. ....................... 257/98 |
| 2011/0049552 A1* | 3/2011 | Pyeon et al. .................... 257/98 |
| 2011/0121335 A1 | 5/2011 | Takakusaki et al. |

(Continued)

FOREIGN PATENT DOCUMENTS

| JP | 2009-059870 A | 3/2009 |
| JP | 2009-176962 A | 8/2009 |

(Continued)

OTHER PUBLICATIONS

Extended European Search Report of the corresponding European Patent Application No. 12744493.3, dated Nov. 11, 2015.

*Primary Examiner* — Thomas L Dickey
(74) *Attorney, Agent, or Firm* — Global IP Counselors, LLP

(57) ABSTRACT

In a light emitting device, a first lead has a first terminal part that is contiguous with a first connector. The first terminal part includes a first convex part that is exposed from a molded article at the inner peripheral face of a mounting recess, and a first concave part that is formed in the rear face of the first convex part.

20 Claims, 13 Drawing Sheets

(56) References Cited

U.S. PATENT DOCUMENTS

| | | |
|---|---|---|
| 2011/0175127 A1 | 7/2011 | Kanada et al. |
| 2011/0199787 A1 | 8/2011 | Kim et al. |
| 2011/0210354 A1 | 9/2011 | Ichikawa et al. |
| 2013/0153942 A1 | 6/2013 | Yamashita |
| 2013/0153952 A1 | 6/2013 | Yamashita |
| 2013/0156058 A1 | 6/2013 | Yamashita |
| 2014/0084320 A1 | 3/2014 | Ichikawa et al. |
| 2015/0198762 A1 | 7/2015 | Kim et al. |

FOREIGN PATENT DOCUMENTS

| | | |
|---|---|---|
| JP | 2009-260075 A | 11/2009 |
| JP | 2009-260076 A | 11/2009 |
| JP | 2009-260077 A | 11/2009 |
| JP | 2009-260078 A | 11/2009 |
| JP | 2010-034295 A | 2/2010 |
| JP | 2010-287914 A | 12/2010 |
| JP | 2012-074663 A | 4/2012 |
| KR | 20100004895 A | 1/2012 |
| TW | M406752 U1 | 7/2011 |
| WO | 2010-026716 A1 | 3/2010 |
| WO | 2012-029910 A1 | 3/2012 |
| WO | 2012-029911 A1 | 3/2012 |
| WO | 2012-029912 A1 | 3/2012 |

* cited by examiner

LIGHT EMITTING DEVICE, METHOD FOR MANUFACTURING LIGHT EMITTING DEVICE, AND PACKAGE ARRAY

CROSS-REFERENCE TO RELATED APPLICATIONS

This application claims priority to Japanese Patent Application Nos. 2011-027214 and 2011-027209 both filed on Feb. 10, 2011. The entire disclosures of Japanese Patent Application Nos. 2011-027214 and 2011-027209 are hereby incorporated herein by reference.

BACKGROUND OF THE INVENTION

1. Field of the Invention

The present invention relates to a light emitting device comprising a light emitting element, to a method for manufacturing a light emitting device, and to a package array.

2. Background Art

Light emitting devices equipped with a light emitting element (such as a light emitting diode or a laser diode) have been widely used in the past as light sources for optical communications devices, lighting fixtures, liquid crystal television backlights, and so forth.

In a light emitting device such as this, the light emitting element is disposed in a mounting recess of a package including leads and a molded article. The light emitting element is mounted on the bottom face of the mounting recess, and is surrounded by the inner peripheral face of the mounting recess.

A method in which the leads are exposed at the inner peripheral face of the mounting recess has been proposed in order to reduce degradation and discoloration of the inner peripheral face by light emitted from the light emitting element (see Japanese Laid-Open Patent Application Publication No. 2008-53726). In this publication, a lead piece having a main body part and wing parts is punched out from sheet metal, and then the wing parts are bent to produce a lead. The wing parts are contiguous with the main body part and bent in the opening direction of the mounting recess, and are exposed at the inner peripheral face.

SUMMARY

However, when a plurality of lead pieces are punched out from a single piece of sheet metal, since each of the leads has wing parts, it is difficult to increase the number of lead pieces that can be punched out from a single piece of sheet metal. This is a problem because it decreases the manufacturing yield of the light emitting device.

The present invention was conceived in light of the above situation, and it is an object thereof to provide a light emitting device, a method for manufacturing a light emitting device, and a package array with which the decrease in the manufacturing yield can be reduced.

The light emitting device pertaining to a first aspect of the present invention comprises a light emitting element and a substantially cuboid package including a molded article and a lead embedded in the molded article. The package has a light emission face, a rear face provided on the opposite side from the light emission face, and a mounting recess that is formed in the light emission face and has a bottom face on which the light emitting element is mounted and an inner peripheral face that is contiguous with the bottom face. The lead has a first convex part that protrudes toward a light emission face side and is exposed from the molded article at the inner peripheral face of the mounting recess, and a first concave part that is formed in a rear face of the first convex part.

Therefore, the first convex part is formed by stamping form the rear face side, which is obvious since the first concave part is formed. Accordingly, the number of lead pieces that can be punched out from a single lead frame can be increased, so there is less of a decrease in the manufacturing yield of the light emitting device.

The light emitting device pertaining to a second aspect of the present invention comprises a light emitting element and a substantially cuboid package including a molded article and a lead embedded in the molded article. The package has a light emission face, a rear face provided on the opposite side from the light emission face, a lower face that is contiguous with the rear face and the light emission face, a side face that is contiguous with the lower face and the light emission face, and a mounting recess that is formed in the light emission face and has a bottom face on which the light emitting element is mounted. The lead has a connector that forms part of the bottom face, and a terminal part that is contiguous with the lower face side of the connector. The terminal part has a convex part that protrudes toward the light emission face side and is exposed from the molded article at the lower face and the side face.

A problem here is that with a side-view type of light emitting device, the standing stability is poor because of the low ratio of depth to height. Accordingly, when the light emitting device is mounted, if the rear face provided on the opposite side from the light emission face is soldered to the mounting face, the light emitting device can be pulled by the solder and end up being inclined.

In view of this, with the light emitting device pertaining to the second aspect, since the terminal part is exposed from the lower face to the side face of the package, during mounting the molten solder is allowed to creep up from the lower face to the side face of the package, so the stress produced by the surface tension of the solder is also exerted in the side face direction. This reduces inclination of the light emitting device during mounting.

The present invention provides a light emitting device, a method for manufacturing a light emitting device, and a package array with which the decrease in the manufacturing yield can be reduced.

DETAILED DESCRIPTION OF THE EMBODIMENTS

Embodiments of the present invention will now be described through reference to the drawings. In the following description of the drawings, those portions that are the same or similar will be numbered the same or similarly. The drawings, however, are merely schematics, and the various dimensional ratios and so forth may be different from those in actuality. Therefore, specific dimensions and the like should be determined by consulting the following description. Naturally, there may be situations in which the dimensional relations and ratios vary from one drawing to the next.

In the following embodiment, a side view type of light emitting device will be described as an example of a light emitting device. A side view type of light emitting device is a type in which light emitted by the light emitting element is taken off in a direction parallel to the mounting face of the mounting board. However, the technology disclosed herein can also be applied to a top view type of light emitting device, and not just a side view type. A top view type of light emitting device is a type in which the light emitted by the light emitting element is taken off in a direction perpendicular to the mounting face of the mounting board.

Also, in the following embodiment, the direction in which the light emitted by the light emitting element is taken off is called the "first direction," the direction perpendicular to the mounting face when the light emitting device is mounted on a mounting face is called the "second direction," and the direction perpendicular to the first direction and second direction is called the "third direction."

1. Simplified Configuration of Light Emitting Device 100

Figure 1:
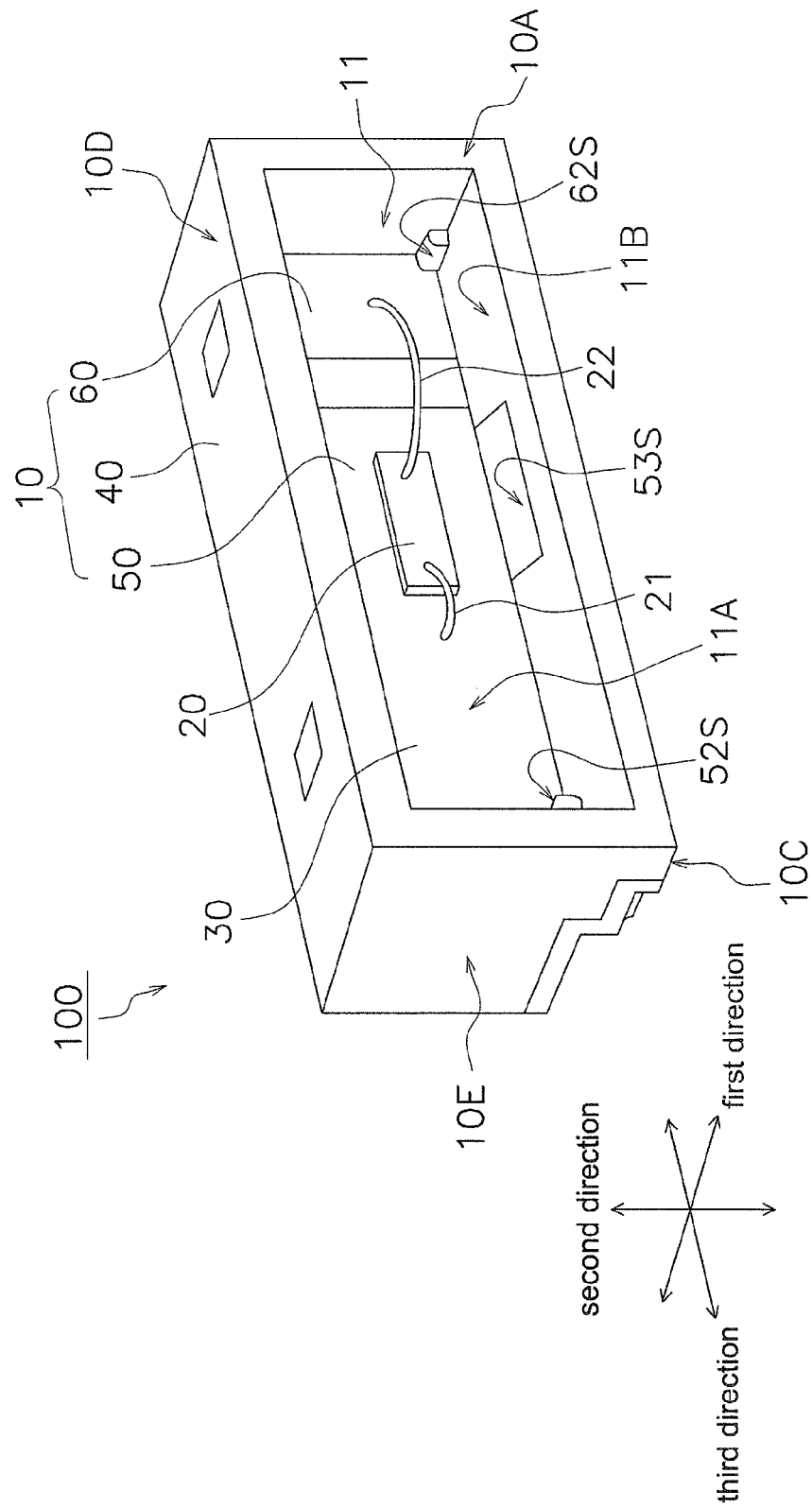
FIG. 1 is a front oblique view of the light emitting device 100 pertaining to an embodiment.
Figure 2:
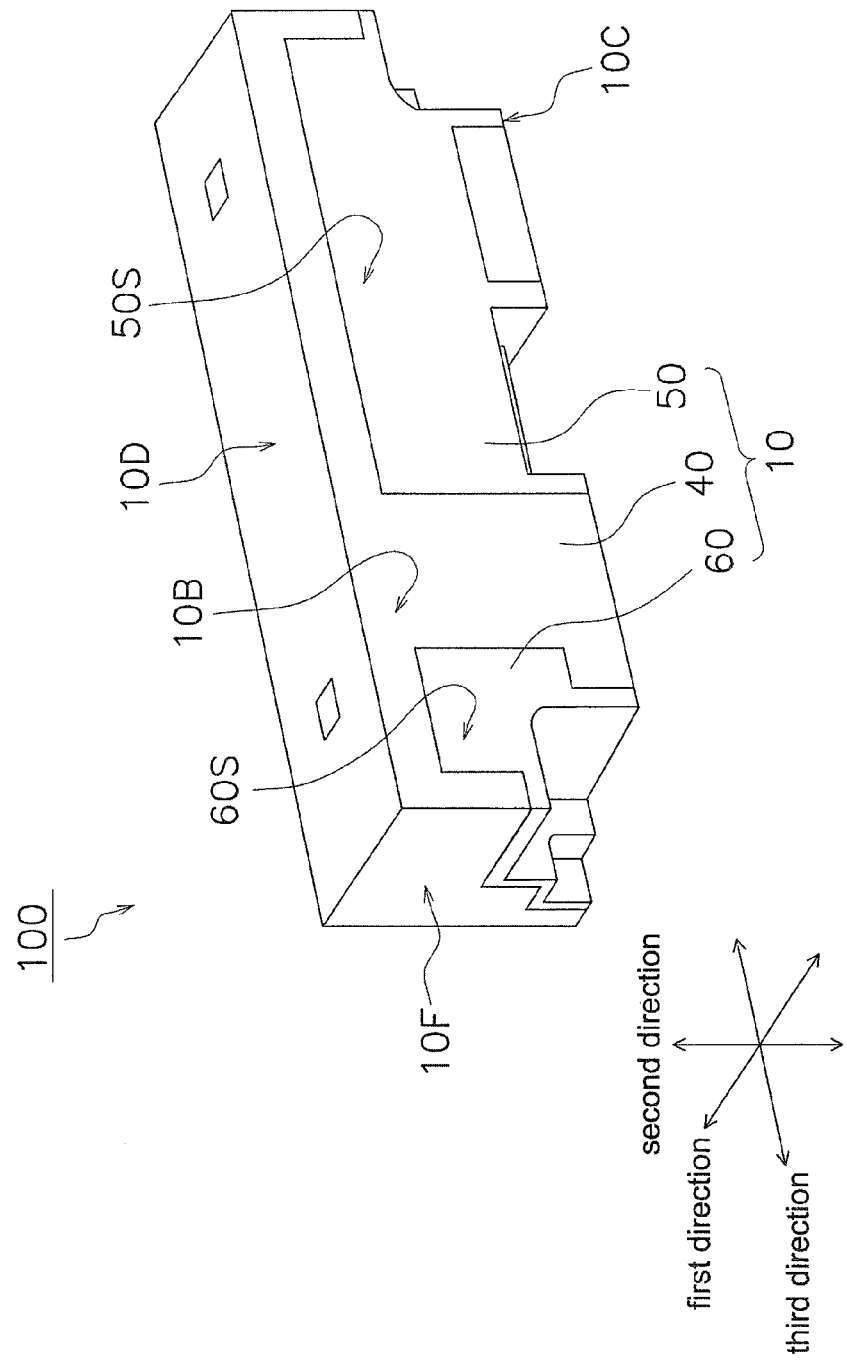
FIG. 2 is a rear oblique view of the light emitting device 100 pertaining to an embodiment.
Figure 3:
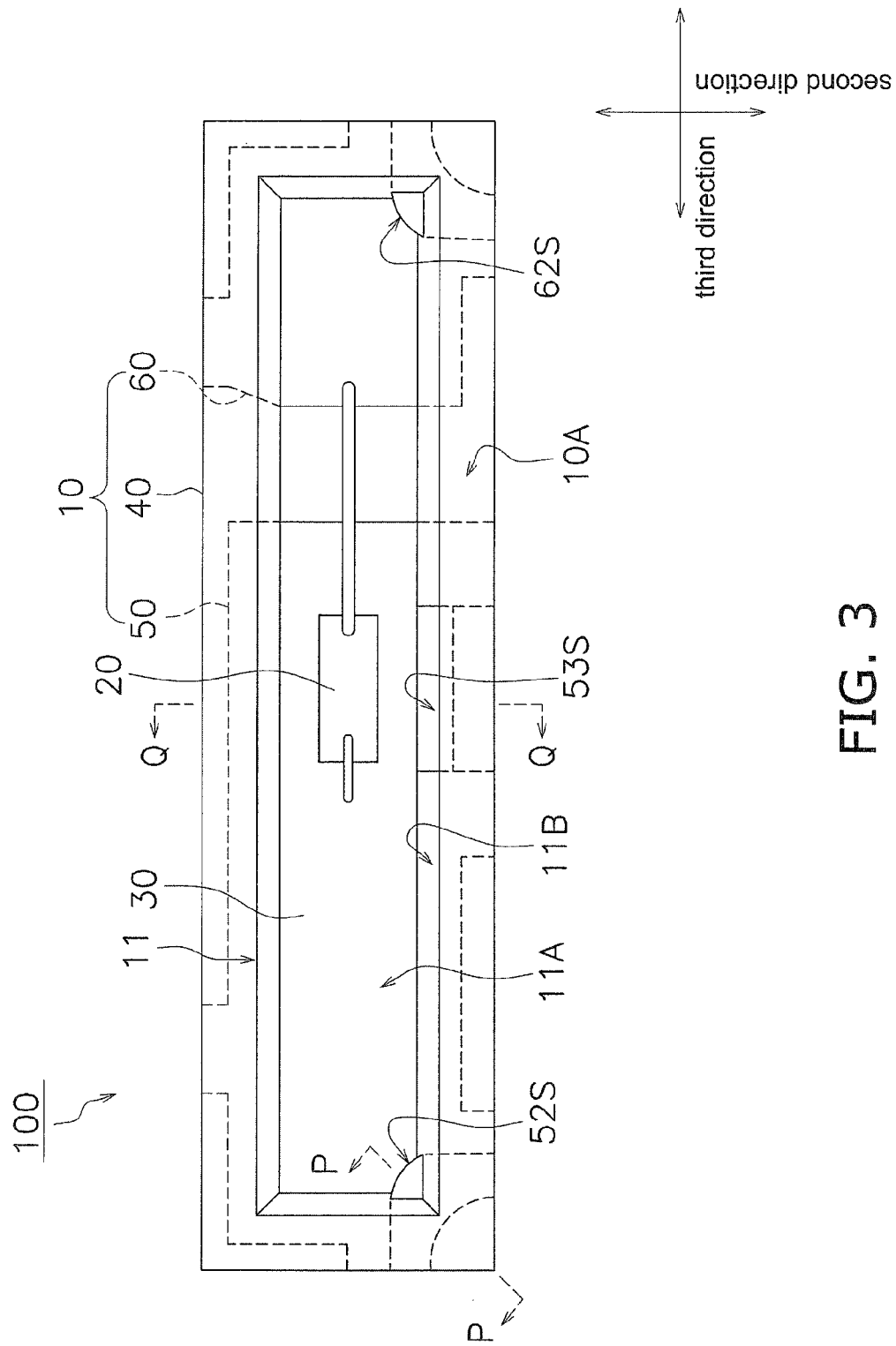
FIG. 3 is a front view of the light emitting device 100 pertaining to an embodiment.
Figure 4:
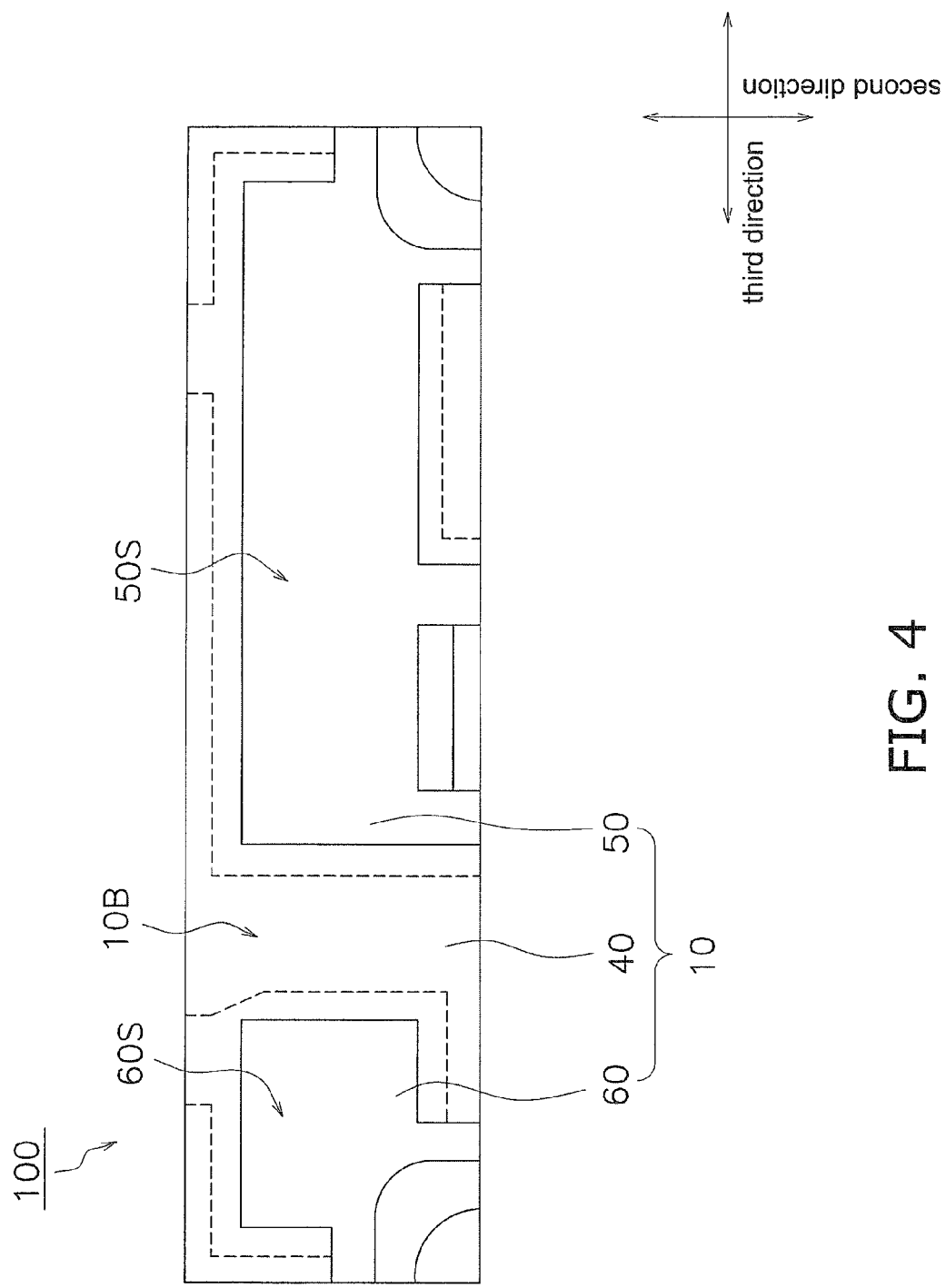
FIG. 4 is a rear view of the light emitting device 100 pertaining to an embodiment.

The simplified configuration of the light emitting device 100 pertaining to an embodiment will be described through reference to the drawings. FIG. 1 is a front oblique view of the light emitting device 100 pertaining to an embodiment. FIG. 2 is a rear oblique view of the light emitting device 100 pertaining to an embodiment. FIG. 3 is a front view of the light emitting device 100 pertaining to an embodiment. FIG. 4 is a rear view of the light emitting device 100 pertaining to an embodiment.

The light emitting device 100 comprises a package 10, a light emitting element 20, and a sealing resin 30. The light emitting device 100 is a side view type of device, and has a substantially cuboid shape that extends in the third direction. The depth of the light emitting device 100 in the first direction is about 1 mm, its height in the second direction is about 1 mm, and its width in the third direction is about 3 mm. The size of the light emitting device 100 is not limited to these numbers, however.

i. Package 10

The package 10 has a substantially cuboid external shape, and forms the contour of the light emitting device 100. The package 10 includes a molded article 40, a first lead 50, and a second lead 60.

The package 10 has a light emission face 10A, a rear face 10B, a lower face 10C, an upper face 10D, a first side face 10E, a second side face 10F, and a mounting recess 11.

The light emission face 10A is perpendicular to the first direction. The light emitted by the light emitting element 20 is taken off from the light emission face 10A. The light emission face 10A is constituted by the molded article 40. The rear face 10B is provided on the opposite side from the light emission face 10A. The lower face 10C is perpendicular to the second direction, and is contiguous with the light emission face 10A and the rear face 10B. The lower face 10C comes into contact with the mounting face when the light emitting device 100 has been mounted. The upper face 10D is provided on the opposite side from the lower face 10C. The first side face 10E is perpendicular to the third direction. The second side face 10F is provided on the opposite side from the first side face 10E.

The mounting recess 11 is formed in the light emission face 10A. The mounting recess 11 is a depression provided for installation of the light emitting element 20. The mounting recess 11 is formed so as to extend in the third direction. The bottom face 11A of the mounting recess 11 is a mounting face used for mounting the light emitting element 20. The inner peripheral face 11B of the mounting recess 11 is contiguous with the light emission face 10A and the bottom face 11A, and surrounds the light emitting element 20. In this embodiment, the mounting recess 11 is formed in a shape that tapers from the light emission face 10A side toward the rear face 10B side. Therefore, the inner peripheral face 11B of the mounting recess 11 is inclined with respect to the bottom face 11A, and functions as a reflector that reflects the emitted light of the light emitting element 20.

As shown in FIGS. 1 and 3, a first terminal inner exposed face 52S and a first heat sink inner exposed face 53S had by the first lead 50, and a second terminal inner exposed face 62S had by the second lead 60 are exposed from the molded article 40 at the inner peripheral face 11B of the mounting recess 11. In this embodiment, the first terminal inner exposed face 52S, the first heat sink inner exposed face 53S, and the second terminal inner exposed face 62S are examples of an "inner exposed face."

As shown in FIGS. 2 and 4, a first rear exposed face 50S had by the first lead 50, and a second rear exposed face 60S had by the second lead 60 are exposed from the molded article 40 at the rear face 10B.

The first terminal inner exposed face 52S, the first heat sink inner exposed face 53S, and the second terminal inner exposed face 62S are part of the inner peripheral face 11B of the mounting recess 11, and the first rear exposed face 50S and the second rear exposed face 60S are part of the rear face 10B of the package 10. The configuration of the first lead 50 and the second lead 60 will be discussed below.

ii. Light Emitting Element 20

The light emitting element 20 is mounted on the bottom face 11A of the mounting recess 11. The light emitting element 20 is electrically connected to the first lead 50 by a first wire 21, and is electrically connected to the second lead 60 by a second wire 22. The light emitted by the light emitting element 20 is taken off in the first direction from the mounting recess 11.

The light emitting element 20 is a semiconductor light emitting element called a light emitting diode, for example. A substrate having a semiconductor such as GaAlN, ZnS, SnSe, SiC, GaP, GaAlAs, AlN, InN, AlInGaP, InGaN, GaN, or AlInGaN as a light emitting layer can be used to advantage as the light emitting element 20, but this is not the only option.

A face-up or face-down structure can be employed for the light emitting element 20. There are no particular restrictions on the size of the light emitting element 20, but it may be about 350 µm square, 500 µm square, or 1 mm square.

iii. Sealing Resin 30

The sealing resin 30 fills the mounting recess 11 and seals the light emitting element 20. Any resin that is translucent can be used as the sealing resin 30, such as one or more types of resin selected from among a polyolefin resin, polycarbonate resin, polystyrene resin, epoxy resin, acrylic resin, acrylate resin, methacrylic resin (PMMA, etc.), urethane resin, polyimide resin, polynorbornene resin, fluororesin, silicone resin, modified silicone resin, modified epoxy resin, and so forth. This material may also contain additives such as diffusion agents, fillers, pigments, or fluorescent substances as discussed in WO2006/038502 and Japanese Laid-Open Patent Application 2006-229055.

2. Molded Article 40

The molded article 40 makes up the outer shape of the package 10. The molded article 40 covers the first lead 50 and the second lead 60 and thereby supports the first lead 50 and the second lead 60.

The molded article 40 includes an insulating material that does not readily transmit the light emitted by the light emitting element 20, external light, or the like, and is also heat resistant and has suitable strength. A triazine derivative epoxy resin, which is a thermosetting resin, is favorable as this insulating material. The thermosetting resin may contain an acid anhydride, an antioxidant, a parting agent, a light reflecting material, an inorganic filler, a curing catalyst, an optical stabilizer, or a lubricant. The light reflecting material can be titanium dioxide contained in an amount of 0 to 90 wt %, and preferably 10 to 60 wt %. However, the materials that make up the molded article 40 are not limited to those listed above, and one or more types of thermosetting resin selected from among epoxy resins, modified epoxy resins, silicone resins, modified silicone resins, acrylate resins, and urethane resins can be used, for example. An epoxy resin, a modified epoxy resin, a silicone resin, or a modified silicone resin is particularly favorable as the material for the molded article 40. Also, a liquid crystal polymer, a polyphthalamide resin, polybutylene terephthalate (PBT), or another such thermoplastic resin can be used as the material constituting the molded article 40.

3. First Lead 50

Figure 5:
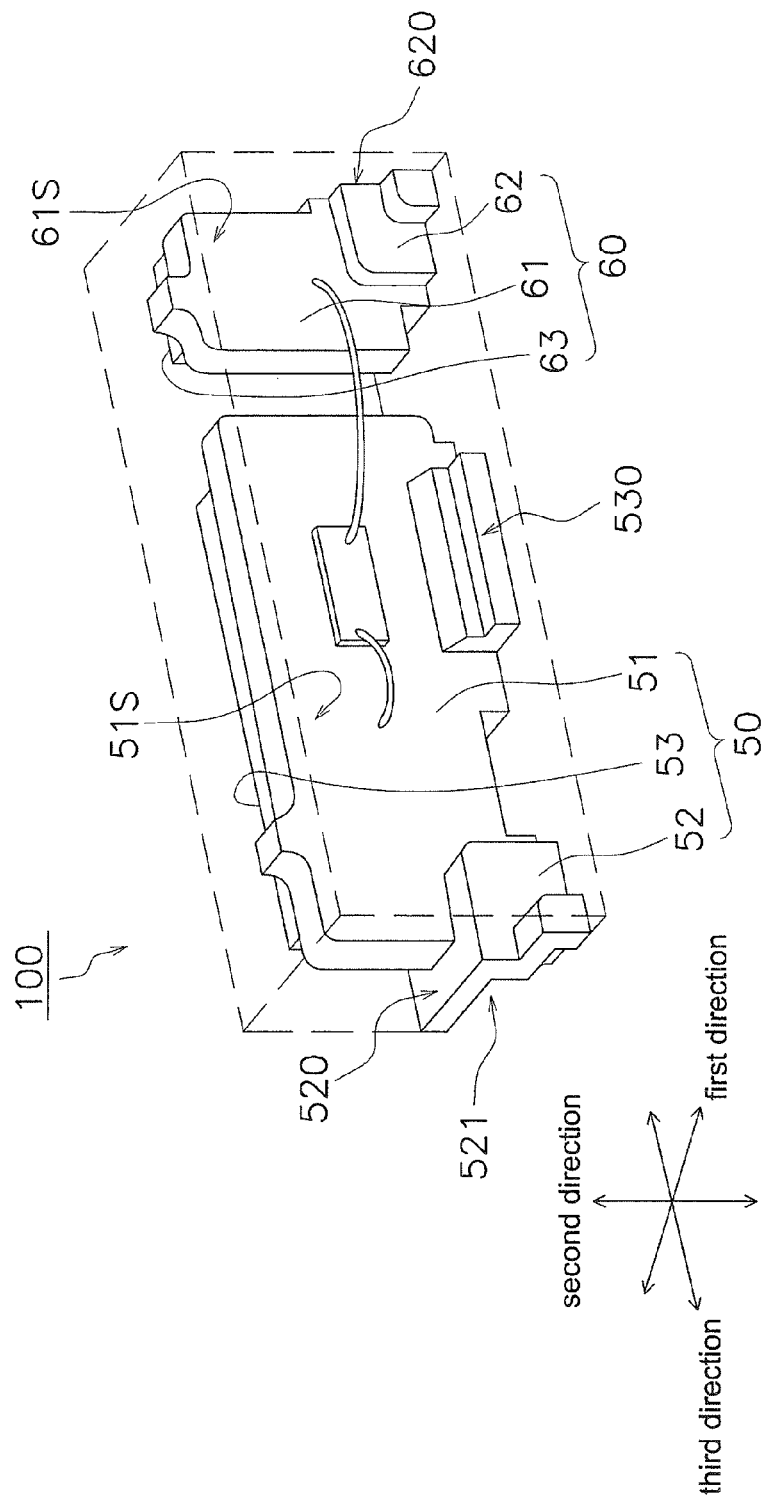
FIG. 5 is a front oblique view of a first lead 50 and a second lead 60.
Figure 6:
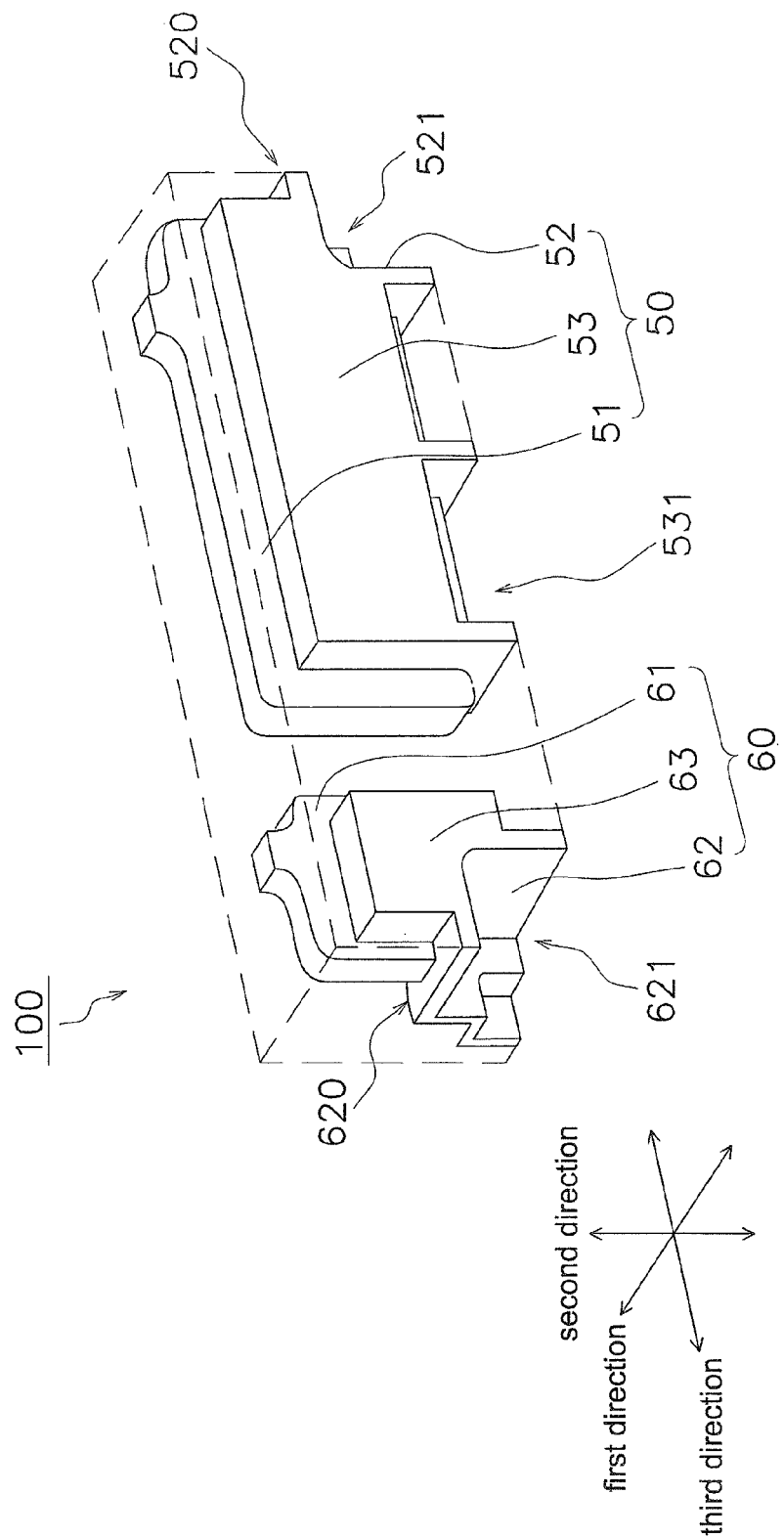
FIG. 6 is a rear oblique view of the first lead 50 and the second lead 60.

FIG. 5 is a front oblique view of the first lead 50 and the second lead 60. FIG. 6 is a rear oblique view of the first lead 50 and the second lead 60. In FIGS. 5 and 6, the contour of the package 10 is indicated by a broken line.

The first lead 50 has a first connector 51, a first terminal part 52, and a first heat sink 53/However, the first connector 51, the first terminal part 52, and the first heat sink 53 are formed integrally, and the boundaries between them are not clearly demarcated.

When dissipation of the heat generated from the light emitting element 20 is taken into account, the first lead 50 is preferably made of a material having a high thermal conductivity (such as at least about 200 W/(m·K)). This first lead 50 can be produced from a single sheet or a laminated sheet of nickel, gold, copper, silver, molybdenum, tungsten, aluminum, gold, iron, or another such metal, or an iron-nickel alloy, phosphor bronze, iron-containing copper, or another such alloy. The surface of the first lead 50 can also be plated with silver.

i. First Connector 51

The first connector 51 is formed in a flat shape, and is disposed in the second direction and the third direction. The first connector 51 forms part of the bottom face 11A of the mounting recess 11. More specifically, the first connector 51 has a first connecting face 51S that is part of the bottom face 11A. The light emitting element 20 is mounted on the first connecting face 51S, and the light emitting element 20 is electrically connected to the first connecting face 51S via the first wire 21.

ii. First Terminal Part 52

The first terminal part 52 is the cathode of the light emitting device 100. The first terminal part 52 is an example of an "outer edge part" that is contiguous with the outer edge on the lower face 10C side of the first connector 51. In this embodiment, the first terminal part 52 is linked to the lower corner on the first side face 10E side of the first connector 51. The first terminal part 52 is exposed from the molded article 40 at the rear face 10B, the lower face 10C, and the first side face 10E.

As shown in FIGS. 5 and 6, the first terminal part 52 has a first terminal convex part 520 (an example of a "convex part") and a first terminal concave part 521 (an example of a "concave part"). As will be discussed below, the first terminal convex part 520 and the first terminal concave part 521 are formed by stamping. During the mounting of the light emitting device 100, the first terminal concave part 521 is filled with part of a solder fillet.

Figure 7:
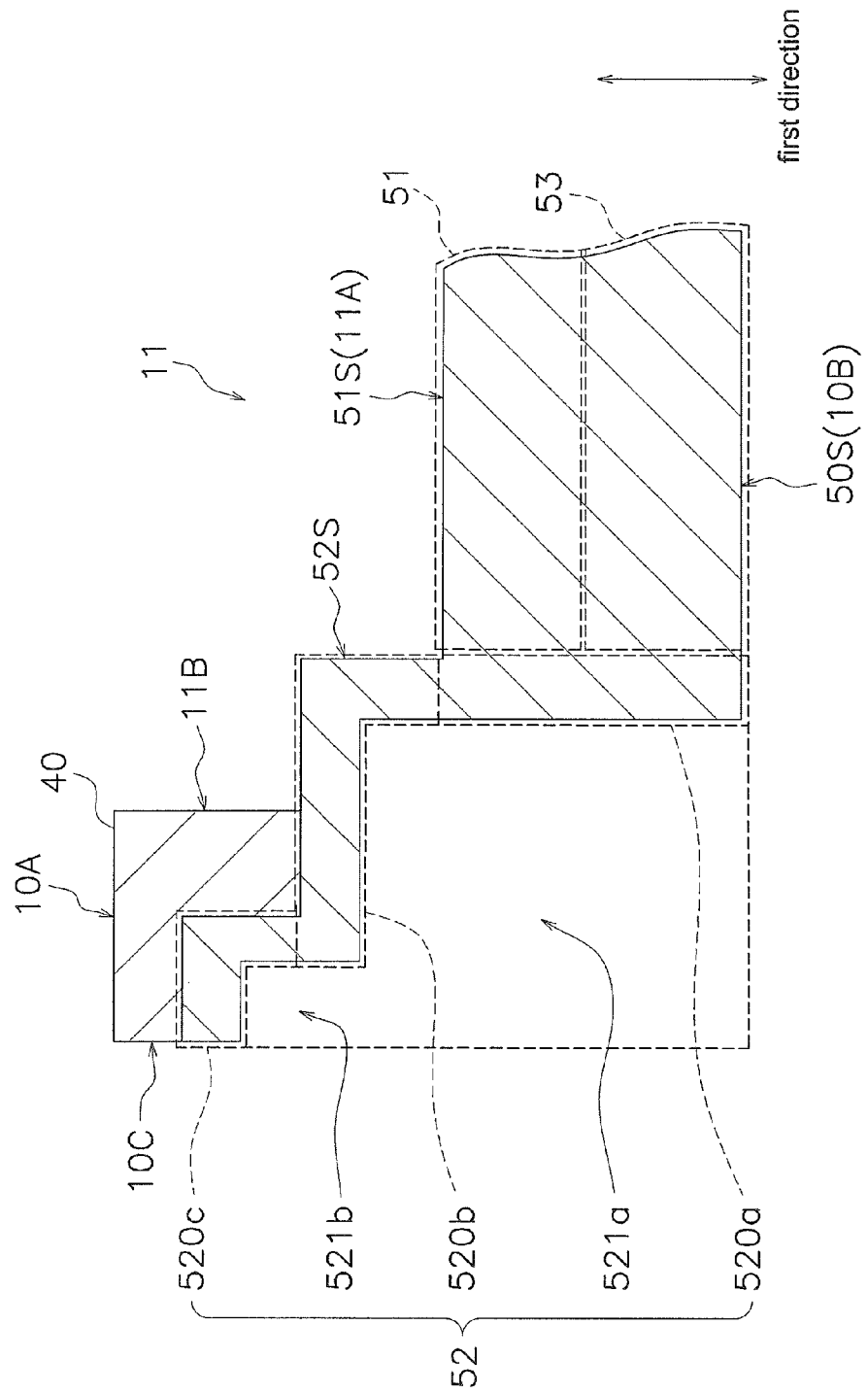
FIG. 7 is a cross section along the P-P line in FIG. 3.

FIG. 7 is a cross section along the P-P line in FIG. 3. As shown in FIG. 7, the first terminal part 52 has an extension part 520a, a first convex part 520b, a second convex part 520c, a first concave part 521a, and a second concave part 521b. The extension part 520a, the first convex part 520b, and the second convex part 520c constitute the first terminal convex part 520, and the first concave part 521a and the second concave part 521b constitute the first terminal concave part 521.

The extension part 520a extends from the outer edge on the lower face 10C side of the first connector 51 toward the rear face 10B of the package 10. In this embodiment, the extension part 520a is contiguous with the outer edge of the first heat sink 53. The extension part 520a is exposed from the molded article 40 at the rear face 10B. The extension part 520a forms part of the first rear exposed face 505 of the first lead 50.

The first convex part 520b is disposed on the light emission face 10A side of the extension part 520a, and protrudes to the light emission face 10A side of the first connector 51. The molded article 40 is disposed on the light emission face 10A side of the first convex part 520b. The first convex part 520b has the first terminal inner exposed face 52S that is exposed from the molded article 40 at the inner peripheral face 11B of the mounting recess 11. The first terminal inner exposed face 52S is contiguous with the bottom face 11A of the mounting recess 11 (the first connecting face 51S), and is disposed at an angle to the bottom face 11A.

The second convex part 520c is disposed on the light emission face 10A side of the first convex part 520b, and protrudes to the light emission face 10A side of the first connector 51. The light emission face 10A of the second convex part 520c is covered by the molded article 40. Also, the second convex part 520c is exposed on the lower face 10C of the package 10.

The first concave part 521a is a depression formed from the rear face 10B of the package 10 toward the first convex part 520b. In this embodiment, the first concave part 521a is provided on the inside of the extension part 520a and the first convex part 520b. The first concave part 521a is an opening that is contiguous with the rear face 10B, the lower face 10C, and the first side face 10E of the package 10.

The second concave part 521b is formed from the first concave part 521a toward the second convex part 520c. In this embodiment, the second concave part 521b is provided on the inside of the second convex part 520c. The second concave part 521b is an opening that is contiguous with the lower face 10C and the first side face 10E of the package 10.

iii. First Heat Sink 53

The first heat sink 53 is used to dissipate heat from the light emitting device 100. The first heat sink 53 is an example of the "outer edge part" that is contiguous with the outer edge on the lower face 10C side of the first connector 51. In this embodiment, the first heat sink 53 is linked to the rear face 10B side and the lower face 10C side of the first connector 51. The first heat sink 53 is exposed from the molded article 40 at the rear face 10B and the lower face 10C.

As shown in FIGS. 5 and 6, the first heat sink 53 has a first heat sink convex part 530 and a first heat sink concave part 531. The first heat sink convex part 530 (an example of a "convex part") and the first heat sink concave part 531 (an example of a "concave part") are formed by stamping, as discussed below. During mounting of the light emitting device 100, a solder fillet is disposed inside the first heat sink concave part 531.

Figure 8:
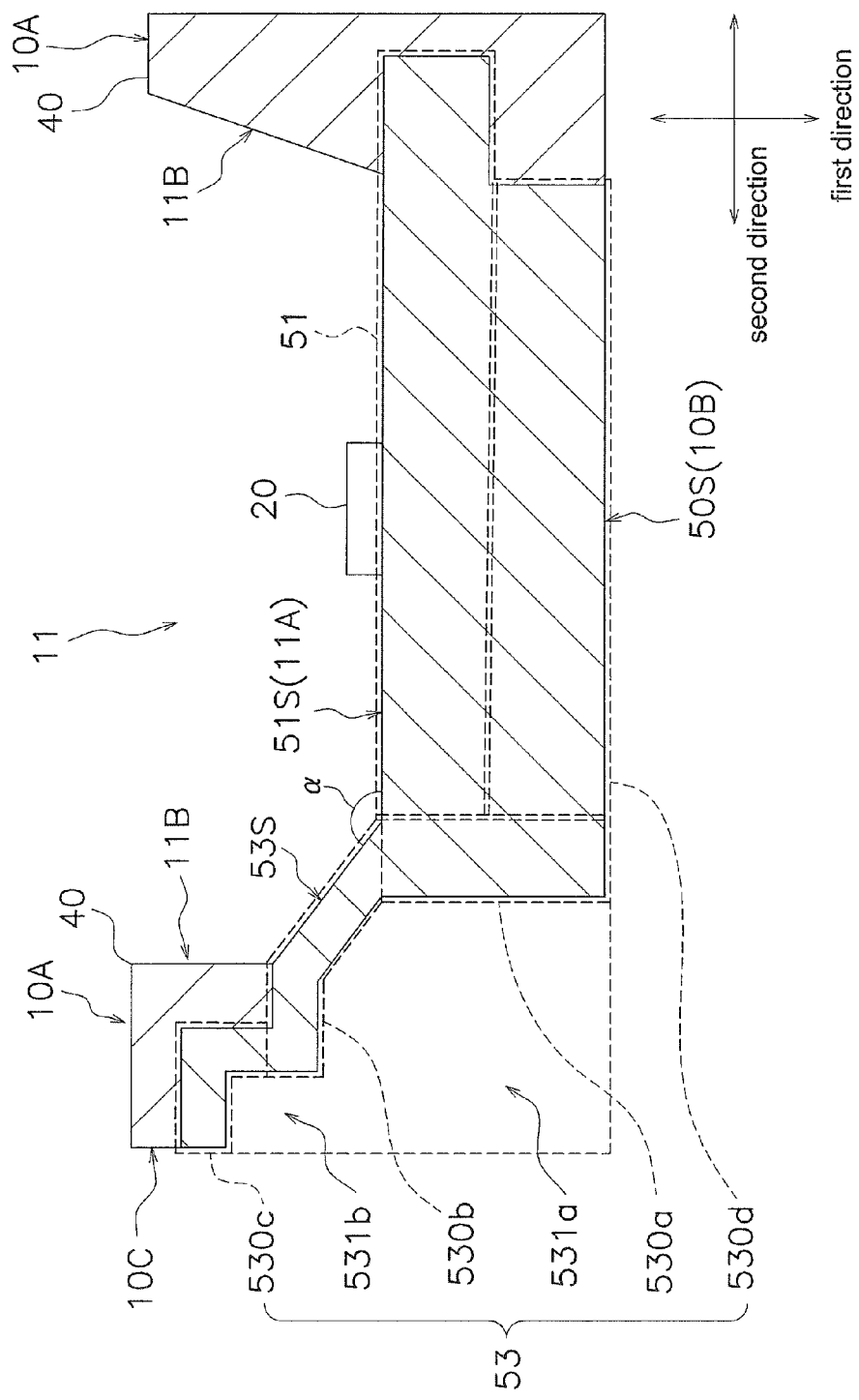
FIG. 8 is a cross section along the Q-Q line in FIG. 3.

FIG. 8 is a cross section along the Q-Q line in FIG. 3. As shown in FIG. 8, the first heat sink 53 has an extension 530a, a first convex part 530b, a second convex part 530c, a rear part 530d, a first concave part 531a, and a second concave part 531b. The extension 530a, the first convex part 530b, and the second convex part 530c constitute the first heat sink convex part 530, and the first concave part 531a and the second concave part 53 1b constitute the first heat sink concave part 531.

The extension 530a extends from the outer edge on the lower face 10C side of the first connector 51 toward the rear face 10B of the package 10. In this embodiment, the extension 530a is contiguous with the outer edge on the lower face 10C side of the rear part 530d. The extension 530a is exposed from the molded article 40 at the rear face 10B. The extension 530a forms part of the first rear exposed face 50S of the first lead 50.

The first convex part 530b is disposed on the light emission face 10A side of the extension 530a, and protrudes to the light emission face 10A side of the first connector 51. The molded article 40 is disposed on the light emission face 10A side of the first convex part 530b. The first convex part 530b has the first heat sink inner exposed face 53S that is exposed from the molded article 40 at the inner peripheral face 11B of the mounting recess 11. In this embodiment, the first convex part 530b is disposed on the lower face 10C side of the light emitting element 20, and the first heat sink inner exposed face 53S is adjacent to and opposite the lower end of the light emitting element 20. The first heat sink inner exposed face 53S is obliquely contiguous with the bottom face 11A of the mounting recess 11. The first heat sink inner exposed face 53S forms an obtuse angle a to the bottom face 11A.

The second convex part 530c is disposed on the light emission face 10A side of the first convex part 530b, and protrudes to the light emission face 10A side of the first connector 51. The outer face of the second convex part 530c (including the light emission face 10A side of the second convex part 530c) is covered by the molded article 40. The second convex part 530c is exposed at the lower face 10C of the package 10.

The rear part 530d is disposed on the rear face 10B side of the first connector 51. The rear part 530d is exposed from the molded article 40 at the rear face 10B. The rear part 530d forms part of the first rear exposed face 50S of the first lead 50. The rear part 530d releases air transmitted from the light emitting element 20 through the first connector 51, from the first rear exposed face 50S into the air.

The first concave part 531a is a depression formed from the rear face 10B of the package 10 toward the first convex part 530b. In this embodiment, the first concave part 531a is provided on the inside of the extension 530a and the first convex part 530b. The first concave part 531a is an opening that is contiguous with the rear face 10B and the lower face 10C of the package 10.

The second concave part 531b is formed from the first concave part 531a toward the second convex part 530c. In this embodiment, the second concave part 531b is provided on the inside of the second convex part 530c. The second concave part 531b is opens in the lower face 10C of the package 10.

4. Second Lead 60

As shown in FIGS. 5 and 6, the second lead 60 has a second connector 61, a second terminal part 62, and a second heat sink 63. The surface of the second lead 60 is plated with silver.

The second connector 61 is similar to the first connector 51 of the first lead 50 in that it has a second connecting face 61S that is part of the bottom face 11A of the mounting recess 11. The second connecting face 61S is electrically connected to the light emitting element 20 via the second wire 22.

The second terminal part 62 is the anode of the light emitting device 100. The second terminal part 62 has a second terminal convex part 620 and a second terminal concave part 621. The second terminal convex part 620 and the second terminal concave part 621 are configured the same as the first terminal convex part 520 and the first terminal concave part 521, so this configuration will not be described again. During mounting of the light emitting device 100, the second terminal concave part 621 is filled with part of a solder fillet.

The second heat sink 63 is used to dissipate heat from the light emitting device 100. The second heat sink 63 is linked to the rear face 10B side of the second connector 61, and is exposed from the molded article 40 at the rear face 10B. The second heat sink 63 is configured the same as the rear part 530d of the first heat sink 53, so this configuration will not be described again.

The second terminal part 62 is an example of the "outer edge part" that is contiguous with the outer edge on the lower face 10C side of the second connector 61.

5. Method for Manufacturing Light Emitting Device 100

The method for manufacturing a plurality of light emitting devices 100 pertaining to an embodiment all at once will now be described through reference to FIGS. 9 to 18.

i. Punching Step

Figure 9:
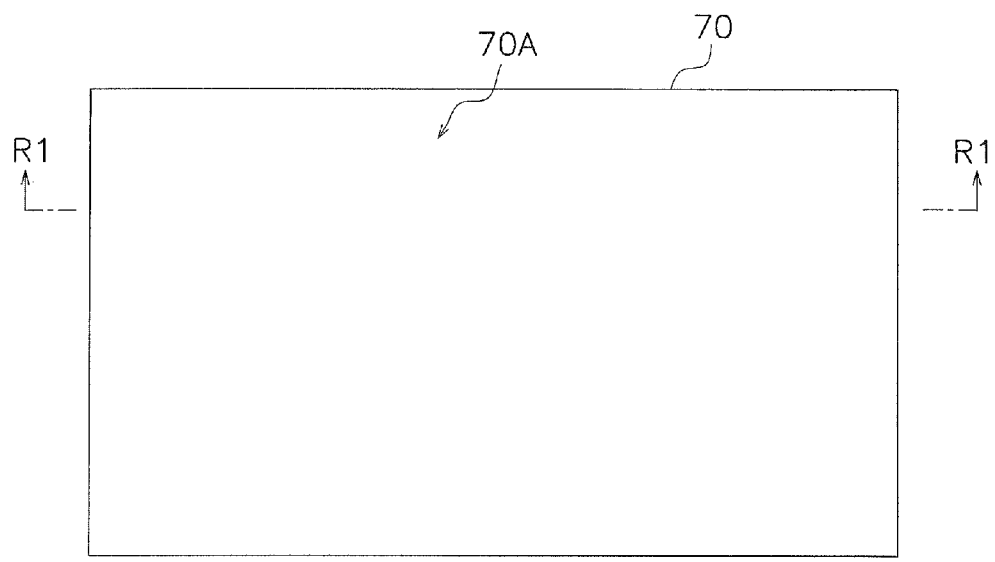
FIG. 9 is a plan view of a metal sheet 70 pertaining to an embodiment.
Figure 10:
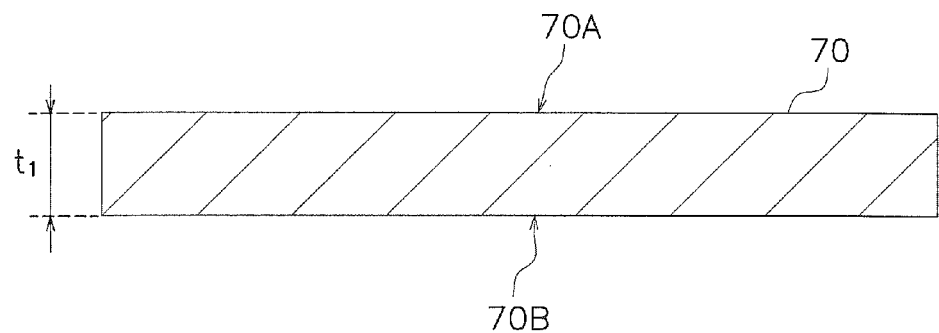
FIG. 10 is a cross section along the R1-R1 line in FIG. 9.
Figure 11:
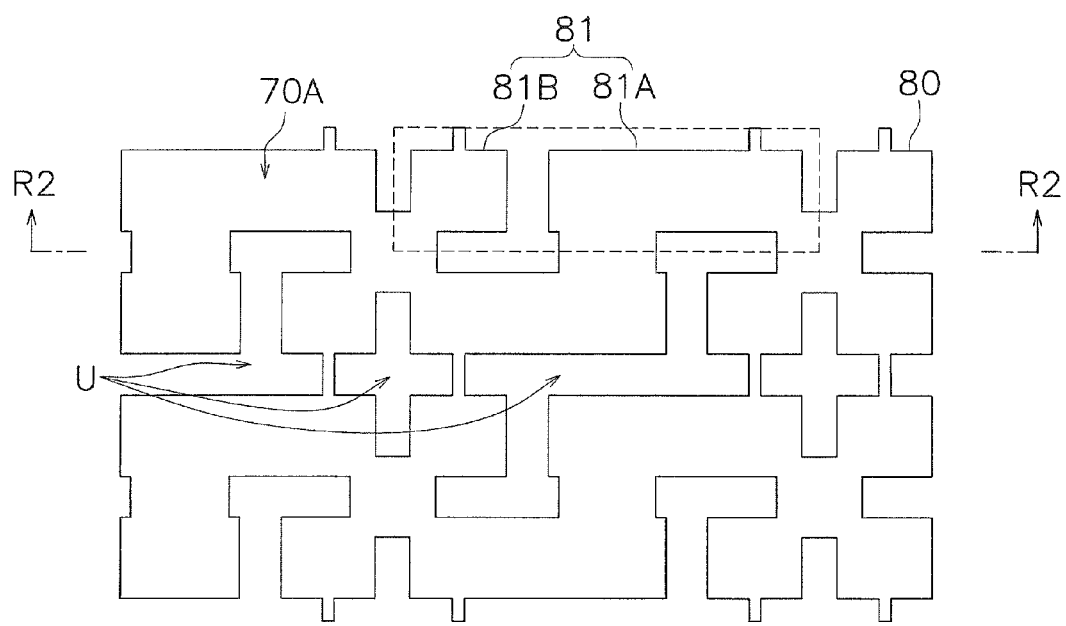
FIG. 11 is a plan view of a lead frame 80 pertaining to an embodiment.
Figure 12:
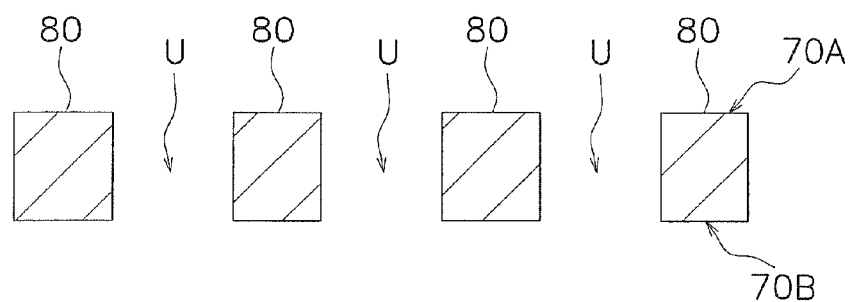
FIG. 12 is a cross section along the R2-R2 line in FIG. 11.

FIG. 9 is a plan view of a metal sheet 70 pertaining to an embodiment. FIG. 10 is a cross section along the R1-R1 line in FIG. 9. FIG. 11 is a plan view of a lead frame 80 pertaining to an embodiment. FIG. 12 is a cross section along the R2-R2 line in FIG. 11.

First, as shown in FIGS. 9 and 10, the metal sheet 70 (in this embodiment, a copper sheet that has been plated with silver) having a first face 70A and a second face 70B provided on the opposite side from the first face 70A is readied. The metal sheet 70 has a first thickness $t_1$ (such as about 0.5 mm).

Then, as shown in FIGS. 11 and 12, punching is performed with a specific punch, which forms a plurality of punched holes U in the metal sheet 70. This forms the lead frame 80 in a specific shape. In this embodiment, the lead frame 80 has a shape in which a pair of lead pieces 81 (the region surrounded by a broken line in FIG. 11) including a first lead piece 81A and a second lead piece 81B are linked alternately in a matrix.

ii. Stamping Step

Figure 13:
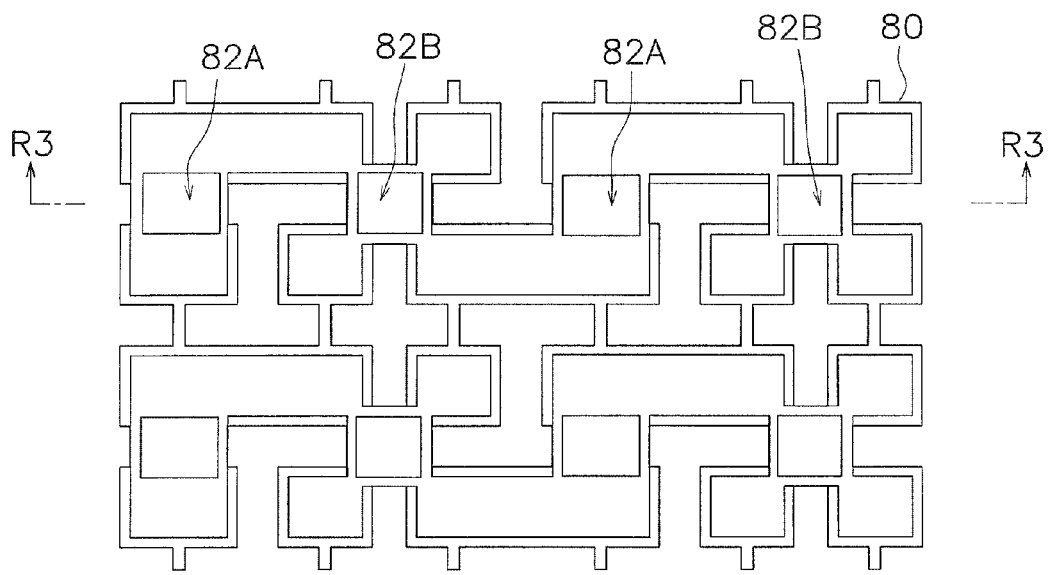
FIG. 13 is a plan view of the lead frame 80 pertaining to an embodiment.
Figure 14:
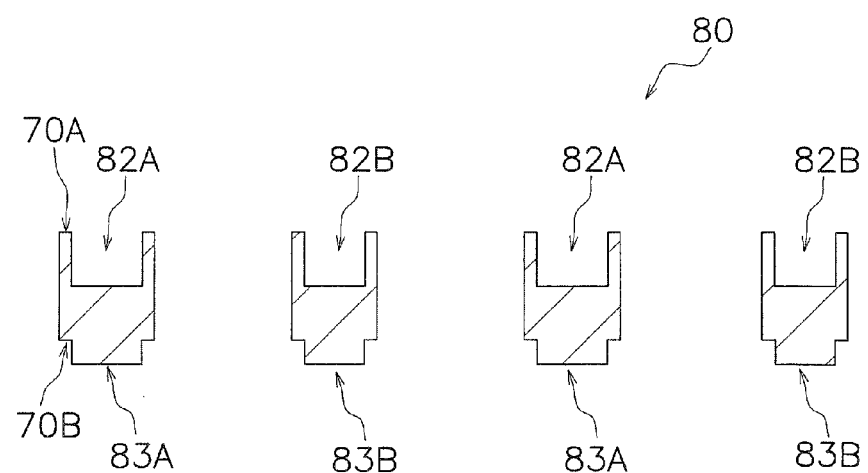
FIG. 14 is a cross section along the R3-R3 line in FIG. 13.
Figure 15:
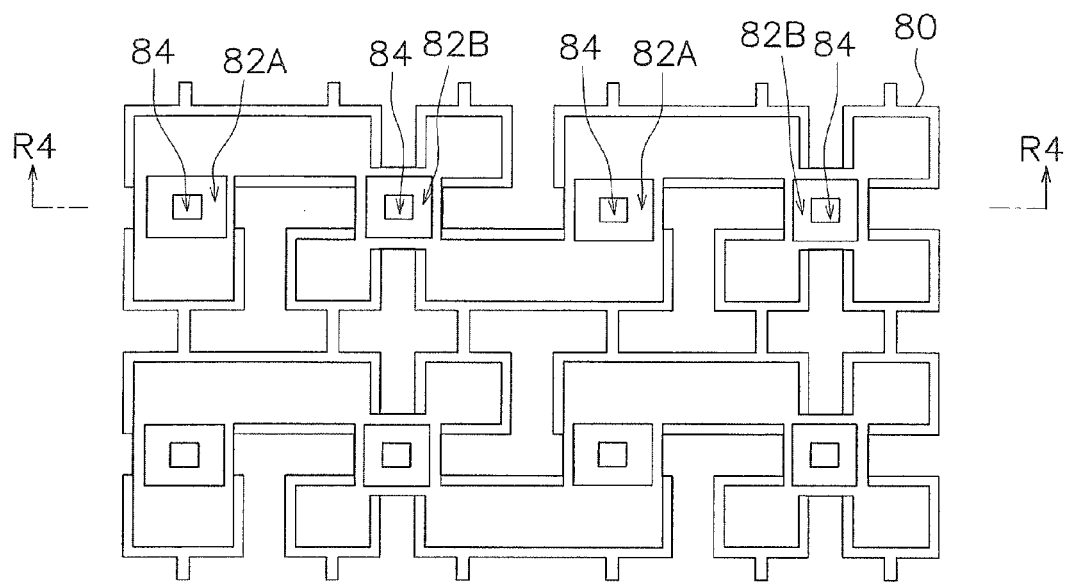
FIG. 15 is a plan view of the lead frame 80 pertaining to an embodiment.
Figure 16:
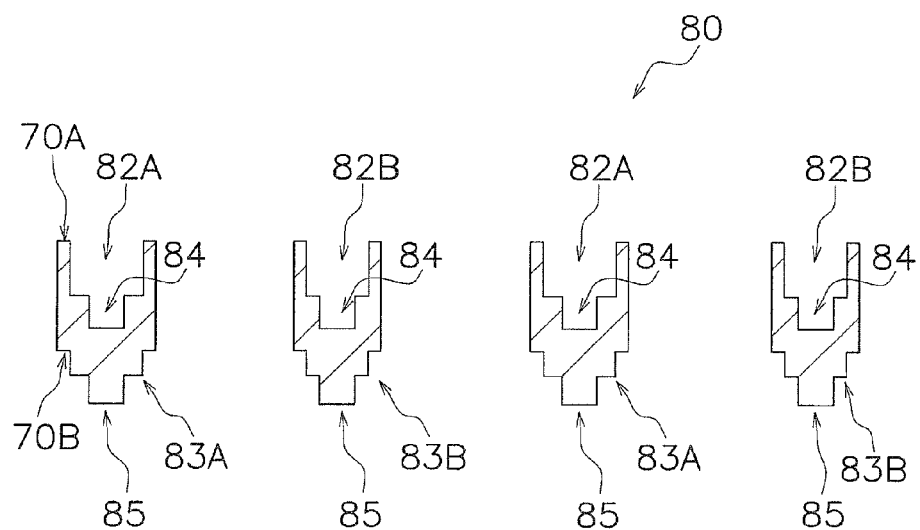
FIG. 16 is a cross section along the R4-R4 line in FIG. 15.

FIG. 13 is a plan view of the lead frame 80 pertaining to this embodiment. FIG. 14 is a cross section along the R3-R3 line in FIG. 13. FIG. 15 is a plan view of the lead frame 80 pertaining to this embodiment. FIG. 16 is a cross section along the R4-R4 line in FIG. 15.

First, as shown in FIGS. 13 and 14, the first face 70A of the lead frame 80 is stamped to form a plurality of first concave parts 82A and a plurality of first concave parts 82B in the first face 70A, and to form a plurality of first convex parts 83A and a plurality of first convex parts 83B that protrude from the second face 70B. Here, although not depicted, an inclined face corresponding to the first heat sink inner exposed face 53S is formed on the side faces of the first convex parts 83A.

As shown in FIG. 13, the lead frame 80 is half blanked with a specific punch so that the thickness of the outer edges of the first lead piece 81A and the second lead piece 81B are a second thickness $t_2$ (such as about 0.3 mm) that is less than the first thickness $t_1$. Consequently, the contact surface area between the lead frame 80 and the resin material can be increased in a package array 90 (discussed below; see FIG. 17).

Next, as shown in FIGS. 15 and 16, the approximate centers of the first concave parts 82A and the first concave parts 82B are stamped to form a plurality of second concave parts 84, and to form a plurality of second convex parts 85 that protrude from the first concave parts 82A and the first concave parts 82B.

iii. Transfer Molding Step

Next, the lead frame 80 is fixed between specific upper and lower molds, and a resin material is injected between the upper and lower molds. The resin material is then heated and cured at a specific temperature to produce the package array 90.

Figure 17:
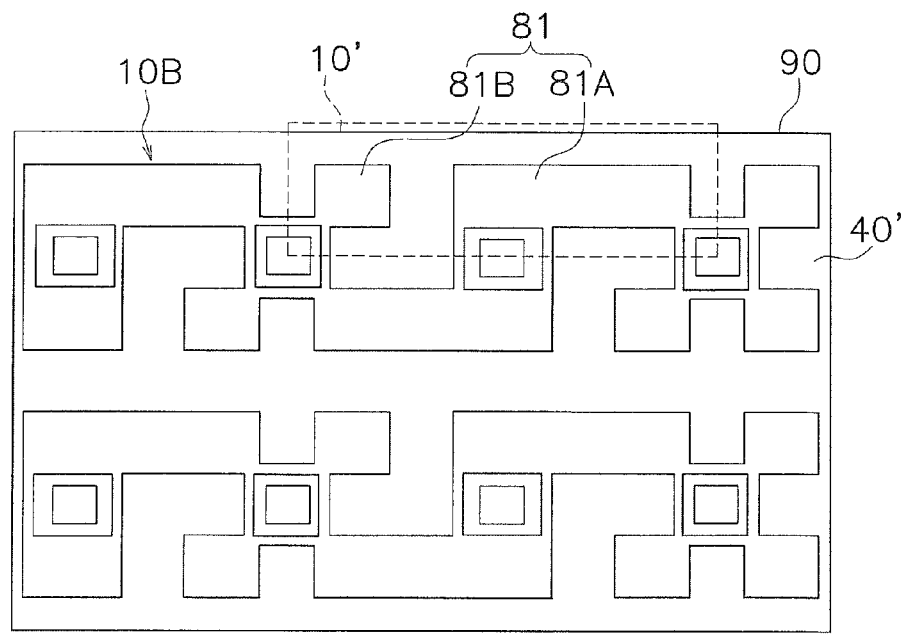
FIG. 17 is a plan view of the rear face side of a package array 90 pertaining to an embodiment.
Figure 18:
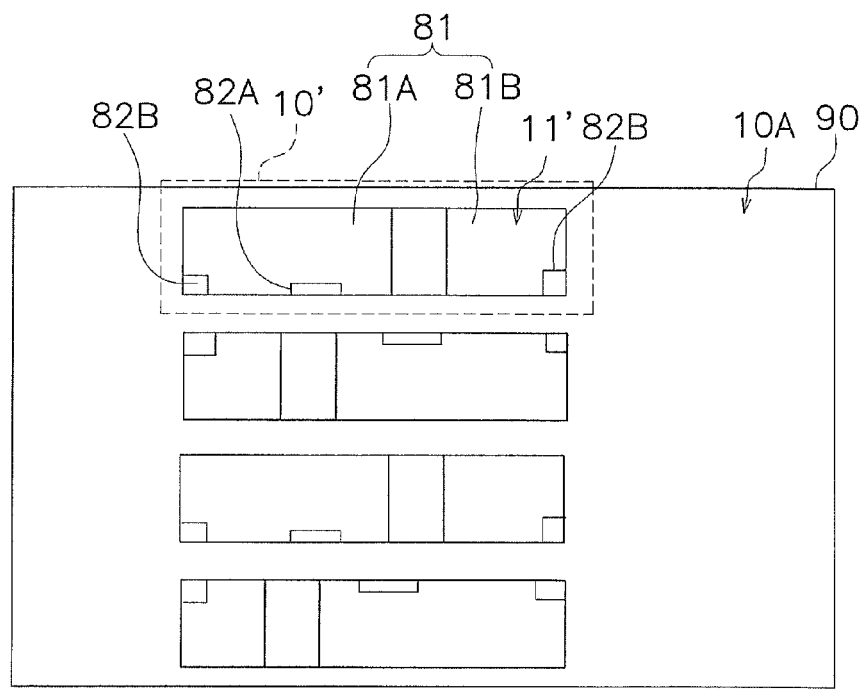
FIG. 18 is a plan view of the light emission face side of the package array 90 pertaining to an embodiment.

FIG. 17 is a plan view on the rear face side of the package array 90 pertaining to this embodiment. FIG. 18 is a plan view of the light emission face side of the package array 90 pertaining to an embodiment.

As shown in FIGS. 17 and 18, the package array 90 has a configuration in which a plurality of packages 10' (the region surrounded by a broken line in FIGS. 17 and 18) having the same configuration as the above-mentioned package 10 are linked together.

More specifically, with each of the packages 10', a pair of lead pieces 81 including a first lead piece 81A and a second lead piece 81B are embedded in a molded resin sheet 40'. Each of the packages 10' has a light emission face 10A, a rear face 10B, and a mounting recess 11' formed in the light emission face 10A. The first lead piece 81A has a first convex part 83A (corresponds to the first convex part 530b of the first heat sink 53) and a first convex part 83B (corresponds to the first convex part 520b of the first terminal part 52) that are exposed at the inner peripheral face of the mounting recess 11'.

iv. Light Emitting Element Connection Step

Next, a light emitting element 20 is connected inside each of the mounting recesses 11' to produce a light emitting device array. More specifically, the light emitting element 20 is mounted on the first lead piece 81A, the light emitting element 20 and the first lead piece 81A are connected with the first wire 21, and the light emitting element 20 and the second lead piece 81B are connected with the second wire 22.

v. Dicing Step

Next, the light emitting device array is cut with a dicing saw to cut out a plurality of light emitting devices 100 from the light emitting device array. After this, the cut faces of the light emitting device array left by the dicing saw are plated with silver, which fills the gaps between the lead pieces and the molded articles with silver, and covers the exposed copper portions with silver. This helps prevent moisture from coming in through the gaps, and improves the wetting of the leads with solder.

6. Action and Effect i. With the light emitting device 100 pertaining to an embodiment, the first lead 50 has the first heat sink 53 that is contiguous with the first connector 51. The first heat sink 53 includes the first convex part 530b that is exposed from the molded article 40 at the inner peripheral face 11B of the mounting recess 11, and the first concave part 531a formed in the rear face of the first convex part 530b.

Since the first convex part 530b is exposed at the inner peripheral face 11B, light emitted by the light emitting element 20 can be received by the first convex part 530b. Therefore, there is less resin degradation and discoloration at the inner peripheral face 11B caused by light emitted from the light emitting element 20.

Also, as is clear from the fact that the first concave part 531a is formed, the first convex part 530b is formed by stamping from the rear face 10B side. More specifically, in this embodiment the first concave parts 82A and first convex parts 83A are formed in the first lead piece 81A by stamping the first face 70A of the lead frame 80. Therefore, the number of lead pieces punched out from a single lead frame 80 can be increased, so there is less of a decrease in the manufacturing yield of the light emitting devices 100.

The first lead 50 has the first connector 51 that forms part of the bottom face 11A of the mounting recess 11, and the first terminal part 52 (an example of an outer edge part) that is contiguous with the outer edge of the first connector 51. The first terminal part 52 has the first convex part 520b and the first concave part 521a. Therefore, the same effect as above can be realized at the first terminal part 52 as well.

ii. The first heat sink 53 further includes the second convex part 530c that protrudes to the light emission face 10A side of the first convex part 530b. The light emission face 10A side of the second convex part 530c is covered by the molded article 40.

Since the second convex part 530c formed in a stepped shape on the first convex part 530b is thus covered by the molded article 40, adhesive strength can be improved between the first lead 50 and the molded article 40.

iii. The molded article 40 is provided on the light emission face 10A side of the first convex part 530b. Therefore, the adhesive strength between the first lead 50 and the molded article 40 can be further improved.

iv. The first convex part 530b is disposed on the lower face 10C side of the first connector 51. Therefore, the center of gravity can be moved down and forward as compared to when the first convex part 530b is disposed on the upper face 10D side or the first side face 10E side of the first connector 51. Accordingly, the standing stability of the side-view light emitting device 100 can be improved.

v. The first convex part 530b has the first heat sink inner exposed face 53S that forms an obtuse angle a to the bottom face 11A of the mounting recess 11. Therefore, the amount of light taken off from the light emitting device 100 can be increased by utilizing the first heat sink inner exposed face 53S as a reflector.

The above effect can also be obtained with the first terminal part 52 that is contiguous with the first connector 51, and the second terminal part 62 that is contiguous with the second connector 61.

vi. The first convex part 530b is disposed on the lower face 10C side of the light emitting element 20, and the first heat sink inner exposed face 53S is adjacent to and opposite the lower end of the light emitting element 20. Therefore, light emitted from the light emitting element 20 is readily received by the first heat sink inner exposed face 53S, so there is less degradation and discoloration of the resin at the inner peripheral face 11B, and light emitted from the light emitting element 20 can be reflected more efficiently.

vii. Also, the first lead 50 has the first connector 51 that forms part of the bottom face 11A of the mounting recess 11, and the first terminal part 52 that is contiguous with the lower face 10C side of the first connector 51. The first terminal part 52 protrudes to the light emission face 10A side, and has the first convex part 520 (an example of a convex part) that is exposed from the molded article 40 from the lower face 10C to the first side face 10E.

Since the first terminal part 52 is thus exposed from the lower face 10C to the first side face 10E of the package 10, during mounting the molten solder is allowed to creep up from the lower face 10C to the side face 10E of the package 10, so the stress produced by the surface tension of the solder is also exerted in the side face direction. This reduces inclination of the light emitting device 100 during mounting.

viii. The first terminal part 52 is exposed from the molded article 40 at the rear face 10B. Therefore, heat generated from the light emitting element 20 can be efficiently dissipated from the rear face 10B side of the first terminal part 52 into the air.

iv. The first terminal part 52 includes the first terminal concave part 521 (an example of a concave part) that is formed in the rear face of the first convex part 520b and the second convex part 520c. Therefore, part of the solder fillet fills the first terminal concave part 521, allowing the light emitting device 100 to be securely mounted, and heat generated from the light emitting element 20 can be efficiently transmitted through the solder fillet to the mounting board.

v. The first terminal convex part 520 (more specifically, the first convex part 520b) is exposed from the molded article 40 at the inner peripheral face 11B of the mounting recess 11. Therefore, light emitted by the light emitting element 20 can be received by the first convex part 520b, so degradation and discoloration of the inner peripheral face 11B by light emitted by the light emitting element 20 can be reduced.

The above effect can also be obtained with the first heat sink 53 that is contiguous with the first connector 51, and the second terminal part 62 that is contiguous with the second connector 61.

Also, with the first heat sink 53, since the first heat sink convex part 530 is embedded in the molded article 40, the adhesive strength can be improved between the first lead 50 and the molded article 40.

7. Other Embodiments

The present invention was described by giving the above embodiment, but the text and drawings that form part of this disclosure should not be construed as limiting this invention. Various alternate embodiments, working examples, and applied technology should be clear to a person skilled in the art from this disclosure.

A. In the above embodiment, the light emitting device 100 comprised a single light emitting element 20, but this is not the only option. The light emitting device 100 may comprise a plurality of light emitting elements 20. In this case, the convex parts of the first terminal part 52, the first heat sink 53, and the second terminal part 62 are each disposed so as to correspond to the plurality of light emitting elements 20. This allows degradation and discoloration of the molded article 40 to be reduced even when there are many light emitting elements 20.

B. In the above embodiment, the outer edge part had a two-level convex part formed by stamping twice, but this is not the only option. A one-level convex part may be formed by stamping a plurality of times, or a multi-level convex part may be formed by a single stamping.

C. In the above embodiment, the cross sectional shape of the convex parts was rectangular, but this is not the only option. The cross sectional shape of the convex parts may instead be trapezoidal, semicircular, etc. The cross sectional shape of the convex parts can be changed as needed, according to the shape of the die that comes into contact with the second face 70B side of the lead frame 80.

D. In the above embodiment, the molded resin sheet 40' was formed by transfer molding, but this is not the only option. The molded resin sheet 40' may instead be formed by compression molding using a resin material that becomes clay-like when heated.

E. In the above embodiment, the lead frame 80 was half blanked by stamping, but this is not the only option. The half blanking of the lead frame 80 may instead be done by etching (including half etching).

F. In the above embodiment, the light emitting device 100 comprised the first terminal convex part 520 corresponding to the first terminal concave part 521, the first heat sink convex part 530 corresponding to the first heat sink concave part 531, and the second terminal convex part 620 corresponding to the second terminal concave part 621, but one or more of these convex parts may be omitted. For instance, even if the light emitting device 100 does not comprise the first terminal convex part 520, the first terminal concave part 521 can still be formed by etching (including half etching).

G. In the above embodiment, the first heat sink 53 comprised the rear part 530d, but this is not the only option. The first heat sink 53 need not comprise the rear part 530d.

H. In the above embodiment, the first terminal part 52, the first heat sink 53, and the second connector 61 were described as examples of an outer edge part, but the location of the outer edge part is not limited to these. Also, the outer edge part may be formed so as to surround the first connector 51 and the second connector 61.

I. In the above embodiment, the molded article 40 was disposed on the light emission face 10A side of the various first convex parts and the various second convex parts, but this is not the only option. The first and second convex parts may be exposed at the light emission face 10A. In this case, the height of the "inner exposed face" that is exposed at the inner peripheral face 11B can be increased, and this reduces degradation and discoloration of the inner peripheral face 11B.

J. In the above embodiment, the outer edge part had a concave part formed in the rear face, but this is not the only option. The outer edge part need not have a concave part.

K. In the above embodiment, stamping was performed in the approximate center of the first concave parts 82A and the first concave parts 82B to form the plurality of second concave parts 84 and to form a plurality of second convex parts 85 that protrude from the first concave parts 82A and the first concave parts 82B, but this is not the only option. Instead, after the second concave parts 84 and the second convex parts 85 have been stamped out, the periphery of the second concave parts 84 may be stamped to form the first convex parts 83A and the first convex parts 83B, and to form first concave parts 82A and first concave parts 82B, which are larger in diameter than the second concave parts 84.

L. In the above embodiment, the thickness of the outer edges of the first lead piece 81A and the second lead piece 81B was adjusted by half blanking of the lead frame 80 to the second thickness $t_2$ (such as about 0.3 mm) that was less than the first thickness $t_1$, but this is not the only option. The half blanking of the lead frame 80 may be omitted.

M. In the above embodiment, the first convex part 530b was disposed on the lower face 10C side of the light emitting element 20, but this is not the only option. The first convex part 530b may instead be disposed on the upper face 10D side of the light emitting element 20.

Thus, the present invention of course encompasses various embodiments and so forth that are not discussed herein. Accordingly, the technical scope of the present invention is intended to be defined only by the invention according to the scope of the following claims.

What is claimed is:

1. A light emitting device comprising:
   a light emitting element; and
   a substantially cuboid package including a molded article and a lead embedded in the molded article,
   the package having a light emission face, a rear face provided on the opposite side from the light emission face, and a mounting recess formed in the light emission face, the mounting recess having a bottom face on which the light emitting element is mounted and an inner peripheral face which is contiguous with the bottom face, the inner peripheral face configured to reflect light emitted from the light emitting element,
   the lead having a first convex part protruding toward the light emission face and a first concave part formed in a rear face of the first convex part, the first convex part at least partially protruding through the molded article at the inner peripheral face of the mounting recess,
   the molded article at least partially covering a light emission face side of the first convex part,
   the first convex part having an inner exposed face that forms an obtuse angle with respect to the bottom face of the mounting recess, and
   the inner exposed face being exposed from the molded article at the inner peripheral face.

2. The light emitting device according to claim 1, wherein the lead has a connector which forms part of the bottom face of the mounting recess, and an outer edge part that is contiguous with an outer edge of the connector, and the first convex part and the first concave part are formed in the outer edge part.

3. The light emitting device according to claim 2, wherein the outer edge part further includes a second convex part protruding toward the light emission face from the first convex part and a second concave part formed toward the second convex part from the first concave part, and the molded article at least partially covers a light emission face side of the second convex part.

4. The light emitting device according to claim 2, wherein the package has a lower face that is contiguous with the rear face and the light emission face, and the first convex part is disposed on a lower face side of the connector.

5. The light emitting device according to claim 1, wherein the first convex part is at least partially exposed from the molded article at the light emission face.

6. The light emitting device according to claim 1, wherein the package further has a lower face that is contiguous with the rear face and the light emission face, and an upper face that is provided on the opposite side from the lower face, and
the first convex part is disposed on a upper face side or a lower face side of the light emitting element.

7. The light emitting device according to claim 1, wherein the lead has a connector which forms part of the bottom face of the mounting recess, and a terminal part which is contiguous with a lower face side of the connector, and the terminal part has the first convex part and the first concave part, and the terminal part is at least partially exposed from the molded article at the rear face.

8. The light emitting device according to claim 1, wherein the lead has a connector which forms part of the bottom face of the mounting recess, and a terminal part which is contiguous with a lower face side of the connector, and the terminal part has the first convex part and the first concave part, and the terminal part is at least partially exposed from the molded article at the lower face and the side face.

9. The light emitting device according to claim 1, wherein the lead further includes a second convex part protruding toward the light emission face side from the first convex part and a second concave part formed toward the second convex part from the first concave part.

10. A package array comprising:
    a plurality of packages linked together, each package including a molded resin board and a lead piece embedded in the molded resin board, each package having a light emission face, a rear face provided on the opposite side from the light emission face, and a mounting recess formed in the light emission face, the mounting recess having a bottom face and an inner peripheral face which is contiguous with the bottom face, wherein
    the lead piece has a first convex part protruding toward the light emission face and a first concave part formed in the rear face of the first convex part, the first convex part at least partially protruding through the molded resin board at the inner peripheral face of the mounting recess,
    the lead piece further includes a second convex part protruding toward the light emission face side from the first convex part and a second concave part formed toward the second convex part from the first concave part, and the molded resin board at least partially covers a light emission face side of the first convex part.

11. A light emitting device comprising
a light emitting element; and
a substantially cuboid package including a molded article and a lead embedded in the molded article,
the package having a light emission face, a rear face provided on the opposite side from the light emission face, a lower face which is contiguous with the rear face and the light emission face, a side face which is contiguous with the lower face and the light emission face, and a mounting recess formed in the light emission face, the mounting recess having a bottom face on which the light emitting element is mounted, and
the lead having a connector which forms part of the bottom face of the mounting recess, and a terminal part which is contiguous with a lower face side of the connector, and
the terminal part having a first convex part protruding toward the light emission face and at least partially exposed from the molded article at the lower face and the side face, and the molded article at least partially covers a light emission face side of the first convex part,
wherein the terminal part is exposed from the molded article at the rear face, and
the terminal part includes a concave part formed in a rear face of the first convex part.

12. The light emitting device according to claim 11, wherein
the first convex part is at least partially exposed from the molded article at an inner peripheral face of the mounting recess.

13. The light emitting device according to claim 11, wherein
the terminal part further includes a second convex part protruding toward the light emission face side from the first convex part and a second concave part formed toward the second convex part from the first concave part.

14. The light emitting device according to claim 13, wherein
the molded article at least partially covers the light emission face side of the second convex part.

15. The light emitting device according to claim 11, wherein
the molded article is made of a triazine derivative epoxy resins.

16. The light emitting device according to claim 11, wherein a surface of the lead is plated with silver.

17. The light emitting device according to claim 11, wherein
the molded article includes titanium dioxide contained in an amount of 10 to 60 wt % and at least one selected from epoxy resins, modified epoxy resins, silicone resins, and modified silicone resins.

18. The light emitting device according to claim 17, further comprising
a translucent sealing resin filling the mounting recess.

19. The light emitting device according to claim 18, wherein
the translucent sealing resin is at least one resin selected from a group consisting of polyolefin resin, polycarbonate resin, polystyrene resin, epoxy resin, acrylic resin, acrylate resin, methacrylic resin, urethane resin, polyimide resin, polynorbornene resin, fluororesin, silicone resin, modified silicone resin, and modified epoxy resin.

20. The light emitting device according to claim 18, wherein
the translucent sealing resin contains fluorescent substantces.

* * * * *